US008509513B2

(12) United States Patent
Piron et al.

(10) Patent No.: US 8,509,513 B2
(45) Date of Patent: *Aug. 13, 2013

(54) POST-ACQUISITION ADAPTIVE RECONSTRUCTION OF MRI DATA

(75) Inventors: Cameron Anthony Piron, Toronto (CA); Jae Koul Kim, Tucson, AZ (US)

(73) Assignee: Hologic, Inc., Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/412,043

(22) Filed: Mar. 5, 2012

(65) Prior Publication Data

US 2012/0275675 A1    Nov. 1, 2012

(51) Int. Cl.
*G06K 9/00* (2006.01)
*A61B 5/05* (2006.01)

(52) U.S. Cl.
USPC ............................ 382/131; 600/410

(58) Field of Classification Search
USPC .............. 382/128–134; 378/4, 5, 21–27, 378/101, 901; 600/407, 410, 425, 427, 524, 600/431, 476; 128/920, 922; 324/307, 309, 324/310
See application file for complete search history.

(56) References Cited

U.S. PATENT DOCUMENTS

| 4,825,162 | A | 4/1989 | Roemer et al. |
| 5,297,551 | A | 3/1994 | Margosian et al. |
| 5,594,337 | A * | 1/1997 | Boskamp ...................... 324/318 |
| 6,281,681 | B1 | 8/2001 | Cline et al. |
| 6,324,243 | B1 | 11/2001 | Edic et al. |
| 6,421,454 | B1 | 7/2002 | Burke et al. |
| 6,421,553 | B1 | 7/2002 | Costa et al. |
| 6,628,983 | B1 | 9/2003 | Gagnon |
| 6,950,492 | B2 * | 9/2005 | Besson .............................. 378/5 |
| 7,020,314 | B1 | 3/2006 | Suri et al. |
| 7,024,027 | B1 * | 4/2006 | Suri et al. ...................... 382/130 |
| 7,155,043 | B2 | 12/2006 | Daw |
| 7,176,683 | B2 | 2/2007 | Reeder et al. |
| 7,245,125 | B2 | 7/2007 | Harer et al. |
| 7,245,694 | B2 | 7/2007 | Jing et al. |
| 7,545,966 | B2 | 6/2009 | Lewin et al. |
| 7,583,786 | B2 * | 9/2009 | Jing et al. ........................ 378/37 |

(Continued)

FOREIGN PATENT DOCUMENTS

| CN | 1640139 A | 7/2005 |
| CN | 101601266 A | 12/2009 |

(Continued)

OTHER PUBLICATIONS

General Electric—Press Release—"GE Healthcare Introduces Ultrasound Fusion; New LOGIQ E9 Merges Real-time Ultrasound with CT, MR and PET," Sep. 2, 2008, 2 pages.

(Continued)

*Primary Examiner* — Abolfazl Tabatabai
(74) *Attorney, Agent, or Firm* — Lando & Anastasi, LLP

(57) ABSTRACT

An improved method for reconstruction of medical images includes the acquisition of k-space data through MRI imaging. Subsequently, subsets of the k-space data are transformed into intermediate images by performing an inverse Fourier transform on selected sets. These intermediate images are saved to a PACS or other memory storage, and can be recalled later to reconstruct an image. By selecting various intermediate images, a user can vary both the spatial and temporal resolution of the reconstructed image after acquisition, thereby providing adaptive reconstruction of images without the need to acquire new data.

18 Claims, 3 Drawing Sheets

(56) References Cited

U.S. PATENT DOCUMENTS

| | | |
|---|---|---|
| 7,809,426 B2 | 10/2010 | Kim et al. |
| 7,881,428 B2 | 2/2011 | Jing et al. |
| 8,155,417 B2 | 4/2012 | Piron et al. |
| 2002/0131551 A1 | 9/2002 | Johnson et al. |
| 2003/0194050 A1 | 10/2003 | Eberhard et al. |
| 2006/0221942 A1 | 10/2006 | Fruth et al. |
| 2011/0134113 A1 | 6/2011 | Ma et al. |

FOREIGN PATENT DOCUMENTS

| | | |
|---|---|---|
| EP | 2503934 A1 | 10/2012 |
| WO | 2006017172 A1 | 2/2006 |
| WO | 2011134113 A1 | 11/2011 |

OTHER PUBLICATIONS

International Preliminary Report of Patentability for International Application No. PCT/CA2010/001871 dated May 30, 2012, 1 page.
International Search Report and Written Opinion of the International Searching Authority for International Application No. PCT/CA2010/001871 dated Mar. 8, 2011, 9 pages.
M. Berger, "Image Fusion and Needle Guidance in Ultrasound", General Electric, Power Point Presentation, date unknown, 17 pages.
P. Mullen and C. Owen, "MR, Ultrasound Fusion: Bridging the Gap Between Clinical Benefits, Access and Equipment Utilization," SignaPULSE—A GE Healthcare MR Publication, Spring 2009, 5 pages.

* cited by examiner

POST-ACQUISITION ADAPTIVE RECONSTRUCTION OF MRI DATA

CROSS-REFERENCE TO RELATED APPLICATIONS

This application claims the benefit of U.S. nonprovisional application Ser. No. 12/056,908, filed Mar. 27, 2008, which issued as U.S. Pat. No. 8,155,417 on Apr. 10, 2012, which claims the benefit of U.S. Provisional patent application Ser. No. 60/920,355 filed Mar. 27, 2007 and entitled Post-Acquisition Adaptive Reconstruction of MRI Data, which is hereby incorporated by reference in its entirety.

BACKGROUND OF THE INVENTION

The field of the invention is magnetic resonance imaging ("MRI") methods and systems. More particularly, the invention relates to systems for managing image data associated with MRI.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems, for example, store a library of such pulse sequences that can be prescribed to meet the needs of many different clinical applications.

The MR signals acquired with an MRI system are signal samples of the subject of the examination and are stored as "raw data", which includes both phase cycling and other data, as well as "k-space data", which relates the signals to Fourier space, or what is often referred to in the art as "k-space". Each MR measurement cycle, or pulse sequence, typically samples portion of k-space along a sampling trajectory characteristic of that pulse sequence. Most pulse sequences sample k-space in a roster scan-like pattern sometimes referred to as a "spin-warp", a "Fourier", a "rectilinear" or a "Cartesian" scan. The spin-warp scan technique is discussed in an article entitled "Spin-Warp MR Imaging and Applications to Human Whole-Body Imaging" by W. A. Edelstein at al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient (Gy) along that direction, and then a spin-echo si to is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

There are many other k-space sampling patterns used by MRI systems. These include "radial", or "projection reconstruction" scans in which k-space is sampled as a set of radial sampling trajectories extending from the center of k-space as described, for example, in U.S. Pat. No. 6,954,067. The pulse sequences for a radial scan are characterized by the lack of a phase encoding gradient and the presence of a readout gradient which changes direction from one pulse sequence view to the next. There are also many k-space sampling methods which are closely related to the radial scan and which sample along a curved k-space sampling trajectory rather than the straight line radial trajectory. Such pulse sequences are described, for example, in "Fast Three Dimensional Sodium Imaging", MRM, 37:706-715, 1997 by F. E. Boada, et at and in "Rapid 3D PC-MRA Using Spiral Projection Imaging", Proc. Soc. Magn. Resort. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia. In projection reconstruction, the number of views needed to sample k-space determines the length of the scan and, if an insufficient number of views are acquired, streak artifacts are produced in the reconstructed image. The technique disclosed in U.S. Pat. No. 6,487,435 induces such streaking by acquiring successive undersampled images with interleaved views and sharing peripheral k-space data between successive image frames. This method of sharing acquired peripheral k-space data is known in the art by the acronym "TRICKS".

There are also a number of variations of this straight line, radial sampling trajectory in which a curved path or a non-rectilinear pattern is used to sample k-space. These include spiral projection imaging, SHELL imaging, and the periodically rotated overlapping parallel lines with enhanced reconstruction (PROPELLER) fast spin-echo (FSE) techniques described by Pipe J G, Farthing V G, Forbes K P, "Multishot Diffusion-Weighted FSE Using PROPELLER MRI", Magn. Reson. Med. 2002; 47:42-52; Forbes K P, Pipe, J G, Karis J P, Heiserman J E, "Improved Image Quality and Detection Of Acute Cerebral Infarction With PROPELLER Diffusion-Weighted MR Imaging", Radiology 2002; 225:551-555; Forbes K P, Pipe, J G, Karis J P, Farthing V, Heiserman J E, "Brain Imaging In the Unsedated Pediatric Patient: Comparison Of Periodically Rotated Overlapping Parallel Lines With Enhanced Reconstruction and Single-Shot Fast Spin-Echo Sequences", AJNR Am J Neuroradiol 2003; 24:794-798. This method uses multishot FSE acquisitions incorporated with a k-space trajectory somewhat similar to that used in the projection reconstruction method.

Irrespective of the sampling method used, after k-space data is acquired, images are reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "re-gridding" or "re-binning" the k-space samples to create a Cartesian grid of k-space samples and then perform a 2DFT or 3DFT on the re-binned k-space data set. In the alternative, a radial k-space data set can also be transformed to Radon space by performing a 1DFT of each radial projection view and then transforming the Radon space data set to image space by performing a filtered backprojection.

As discussed above, collected k-space data is a subset of the "raw data", which is stored in a file called a raw data file in the data storage of an MR imaging system, usually in volatile memory. The format of each raw data file is vendor, and in some cases, scanner-type specific. However, raw data files usually include two parts, a header and a body. The header provides an identifier to the data or gives a file name for the data or provides ancillary non-image information, and typically contains patient information and pulse sequence information, including time of acquisition. The body contains the actual raw data that has been collected during the pulse sequence, usually in a chronological order. Typically, a pulse sequence obtains information from multiple slices of the body. The raw data is not slice specific and contains data from all slices selected prior to running the pulse sequence. The raw data in the data section is often maintained or stored in volatile memory in a sequence that is in the order of data acquisition.

After image reconstruction, the reconstructed image is stored in an MRI image file, which can be stored either locally, or in a Picture Archive Communication System (PACS). MR image files are usually in a vendor-independent format called DICOM. Using the DICOM format, each MR image file has a header portion and a body portion. The header portion contains information similar to that located in the raw data header as well as information about the specific corresponding imaging slice, e.g. image slice number. The body portion contains the actual image data Typically, each MR image file contains image data about one imaging slice.

Although the MR image file is retained, the "raw files" including the underlying k-space data are not retained, or at best are retained only in the vendor-specific format. Therefore, in these prior art methods, the underlying data acquired during the scan is lost, and if additional views or visualization is required beyond the reconstructed scans, additional scans must be performed, and new sets of data must be acquired. It would be desirable, therefore, to retain a representation of the underlying k-space data and the associated identifying data to allow for additional images to produced after the data is acquired.

SUMMARY OF THE INVENTION

The present invention is a method for storing image data for reconstruction of MRI images. The method comprises the steps of acquiring subsets of k-space data through magnetic resonance imaging, optionally filtering said data, performing an inverse Fourier transform of said data to form all intermediate image, saving the intermediate images in a standard format, and repeating steps a through c until the subsets of k-space data for an entire scan is stored in a corresponding intermediate images. The saved intermediate images are stored in a storage medium wherein the images can be retrieved and summed to reconstruct the image of the scan.

In another aspect of the invention, a method for post-acquisition reconstruction of an image from magnetic resonance data using is disclosed. In this method, k-space data is acquired through magnetic resonance imaging. An inverse Fourier transform on selected portions of the k-space data to construct corresponding intermediate images, and the intermediate images are stored in a data storage medium. A plurality of intermediate images are retrieved from storage and a selected view is constructed by summing the plurality of intermediate images.

In a particular embodiment, the step of acquiring a portion of k-space data comprises performing a radial acquisition of k-space data at continuously incrementing angles over a predetermined time, and collecting a corresponding portion of k-space data for each radial arm of k-space data is per RF excitation during a selected time interval. From this data a high resolution spatial image can be reconstructed, as well as high temporal resolution images, providing a base spatial reconstruction for comparison to changes over time, particularly as a contrast agent is administered.

This invention therefore provides a system for reconstruction of MRI images after data acquisition. There are three key features of this system. First, intermediate images corresponding to sub-sets of k-space data acquired during data acquisition are stored on an image storage system. Second, reconstruction is performed at later time using simple summation of corresponding intermediate image data to create final images. Third, this final image reconstruction can be performed from these stored intermediate images based on user-defined and user-modifiable parameters such as spatial and temporal resolution, e.g. adaptive reconstruction.

This invention also provides an imaging system for delayed final reconstruction of images after data acquisition. The basic principle of this imaging system is (1) a division of the standard multi-step image reconstruction using intermediate images reconstructed from sub-sets of collected data (2) storage of intermediate image files, and (3) reconstruction of final images (completed reconstruction) from intermediate images (partially reconstructed data) at a later time. A preferred embodiment in MRI would be an imaging system for use with radial techniques of k-space acquisition and an adaptive reconstruction interface.

In the case of MRI, conceptually, this system takes advantage of the mathematical equivalence of a partially reconstructed image (for which an Inverse Fourier Transform has been applied), and the corresponding sub-set of k-space data (highlighting the relationship of the image domain versus the k-space domain). A full set of collected k-space data is equal to the sum of sub-sets of k-space data. The Inverse Fourier Transform of the full set of collected k-space data is also equal to the sum of the Inverse Fourier Transforms of sub-sets of the collected k space data. Thus, the result of a delayed reconstruction of a final image by summation of the intermediate images is equivalent to a full initial reconstruction of k-space data into one single final image. The delay in reconstruction permits the use of intermediate image storage mediums such as PACS and is easily amenable to adaptive reconstruction with a user interface for real-time or neat-real-time adjustment.

There are numerous characteristics of the present technology. First, image reconstruction may be performed on sub-sets of acquired data during the time of initial data acquisition. The resulting images are called intermediate images. In the case of MRI, sub-sets of k-space data are used. Also with regard to MRI, raw data files are no longer used after this point and standard image filtration is not necessarily performed at this point. With any modality, the original data is not necessarily required for later use as partial image reconstruction has been performed.

Second, the resulting intermediate images may be stored on an image storage system. In medical imaging, this storage system may be a Picture Archiving Communications System (PACS) and the intermediate image format may be in a standard vendor-independent format such as DICOM. PACS systems are available in most clinical settings.

Third, final image reconstruction is performed at later time, nominally using simple summation of corresponding image data, although other algorithms may be used, e.g. adaptive filtering in the image or frequency domain.

Fourth, in one MRI form of this invention, an adaptive reconstruction technique may be used. Final image reconstruction can be performed from the stored intermediate images based on user-defined and user-modifiable parameters such as spatial and temporal resolution. Real-time or near-real-time parameter variation and final image reconstruction can be performed by the user if desired.

Additionally, this invention may be used for other forms of medical imaging, such as multi-detector computed tomography (MDCT).

These and other aspects of the invention will become apparent from the following description. In the description, reference is made to the accompanying drawings which form a part hereof, and in which there is shown a preferred embodiment of the invention. Such embodiment does not necessarily represent the fall scope of the invention and reference is made therefore, to the claims herein for interpreting the scope of the invention.

GENERAL DESCRIPTION OF THE INVENTION

Figure 1:
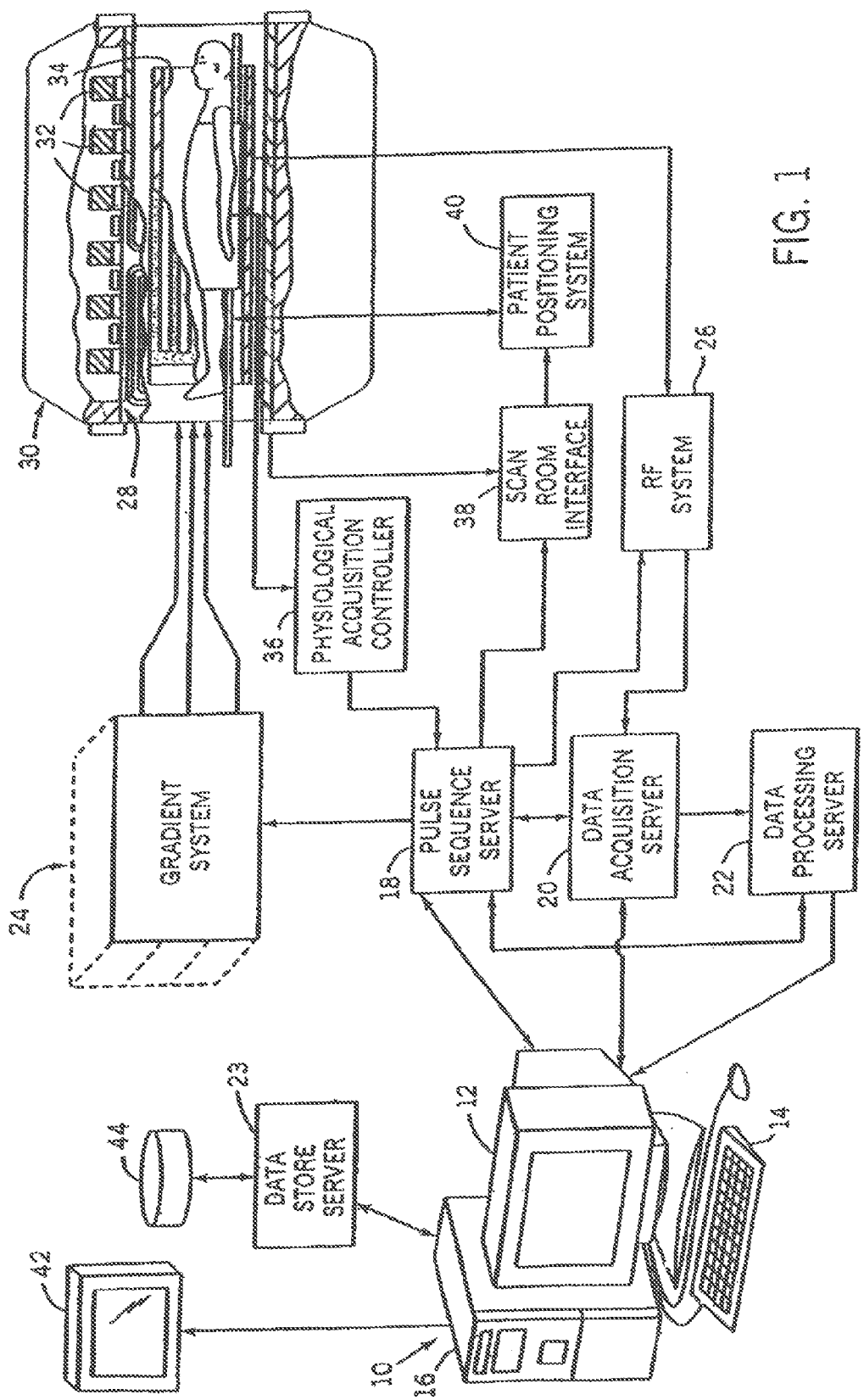
FIG. 1 is a block diagram of an MRI system which employs the present invention.

Adaptive reconstruction describes a method of reconstructing final image data from acquired raw data that has information to create both high spatial resolution low temporal images as well as lower spatial resolution high temporal images. For instance, a pulse sequence may acquire data continuously in a projection reconstruction manner over a period of minutes, e.g., 3-10 minutes, such as during breast MRI, after an intravenous injection of contrast. Traditionally, final images are created by combining k-space data from serial acquisitions over a long time period in order to create high spatial resolution images, or over a short time period to create high temporal resolution images. In adaptive reconstruction, raw data is transformed into intermediate images (imagewise organized multiple pixels, partial digital lines, complete digital lines, groups of digital lines, etc., but less than an entire frame of an image). These intermediate images are stored. An operator determines or commands specific or general parameters that are to be used in the reconstruction of an image (e.g., spatial resolution, temporal resolution, contrast factors, etc.), and intermediate image data is reconstructed according to the commanded parameters to form a final image. The manner of data flow and reconstruction is along the standard technique of completing k-space acquisition prior to inverse Fourier Transform (image reconstruction) and image filtering.

A method of post-acquisition reconstruction of an image from magnetic resonance data using an intermediate step of partially reconstructed images according to the present technology includes:

a. providing partial k-space data through magnetic resonance imaging;

b. performing Fourier reconstruction of the partial k-space data into intermediate images c. storing the intermediate images in a data storage media d. retrieving a multiplicity of stored intermediate images and constructing a final viewable image by aggregating the multiplicity of stored intermediate images.

The constructing, reconstructing and aggregating of partial k-space data and intermediate images' data is done along rational imaging methodologies. Data on particular areas are combined with data from the same particular area, data in time sequences are combined in an order consistent with the sequence of time events, data with image effects from patient movement may be sharpened before being used in the construction or aggregation of data, and the like. Available algorithms for combining the data are known, and by retaining the intermediate images, specialized images of particularly desired areas and/or particularly desired time sequences can be constructed to provide a viewable image that was not an actual image taken by an actual scan by the MRI. The reconstructed image (actually an originally constructed virtual image from real data) may be configured along plane lines other than those of the actual scans (by taking data points from among a series of adjacent planar scans so that a plane of data, or approximate plane of data is created) so that an image can be originally constructed along a selected data plane for which no actual direct image was taken. For example, if the plane of original slice imaging was essentially perpendicular to the spine of a patient, and if an image is desired that shows a particular element (e.g., a duct, vein, artery, wound, scar, etc.) that exists in a different angular orientation than the slices, a virtual plane can be constructed through the intermediate images, all data points along the intersection of the plane with the intermediate images aggregated, and any missing data between points established by interpolation between the points on adjacent planes where actual intermediate images have been created. The angle of the plane would be selected to have the particular element lie within the virtual plane.

This invention describes a system for the capture of digital image data, transformation of captured digital image data into intermediate image data files, storage of the intermediate image data files and reconstruction of final MRI images from the intermediate image data files after data acquisition and storage. It has a unique data flow and methodology (FIG. 2) that is distinct from the prior art (FIG. 1). An additional key concept is the use of the understanding that the sum of two image data sets is equivalent to the sum of the corresponding two k-space data sets. All data addition (e.g., referring to the reconstruction of the final image from the intermediate image data) in the proposed concept is performed in the image domain rather than in the k-space domain. This feature provides salient advantages for a unique form of adaptive reconstruction and visualization sa described in the following sections.

A. Partial Data Set Acquisition

Sub-sets of k-space data are initially reconstructed into images, which can be called intermediate images. The sub-set of k-space data is highly variable. Nominally, it may be a single point of k-space data. It can be a line of k-space data in a Kumar-Welti-Ernst acquisition or projection reconstruction acquisition. The intermediate image reconstruction involves an Inverse Fourier Transform. Filters may be applied by multiplication prior to reconstruction. A time-stamp based on the time of acquisition of the data is placed in the DICOM image header section.

B. Image Storage

The resulting intermediate images are then saved on an image storage system or medium. Typically, the intermediate images are maintained in DICOM format. This can be something portable like a CD or DVD or can be more complicated as in PACS network. The intermediate images can be saved for an indefinite period of time.

It is desirable at this stage of the description of the technology to appreciate the nature of the intermediate images and intermediate image data. The original imaging system provides raw data which can be considered to correspond to either "spots" (single point data signals) or pixels (the smallest element of image content, which in some other imaging systems formed from combinations of spots). These raw data elements also carry identifiers so that specific raw data elements can be retrieved or operated upon in a meaningful manner by operation of software. Because of the total volume of data content needed in provision of data for an entire image in raw data form, raw data is usually retained in volatile memory or limited local disk storage with automated first-in-first-out deletion so that storage space for the entire image data content can be reduced. Additionally, generation of an image from raw data every time an image is desired would use significant computing power and increase the time in which the final image can be displayed. This is one reason by complete images are stored, with a single image identifier (as in DICOM) with image data information also associated with the file for the complete final image. However, storage of final images limits the utility of the images and, within specific imaging, display and storage systems, may limit the ability of images to be conveyed or used by other imaging, display and storage systems, mainly because of unique and proprietary software. Once reconstruction has occurred and the raw data is lost, no other image reconstructions may be performed.

According to the present proprietary technology, raw data is converted (e.g., by Fourier transform, partial Fourier transform, or half-Fourier transform, etc.) into a common or universal language file (e.g., DICOM, . . . , etc.). The transformation is not done into a complete and final image that would effectively complete a frame of an image. Rather, the adaptive reconstruction system defines at least one range of data (e.g., pixels or spots from raw data) that is less than an entire final image (e.g., less than 5% of the image data content in a final image frame, preferably less than 2%, more preferably less than 1% of the image data content in a final image frame, and even less than 0.1% or less than 0.01% of the total image data), such as a single scan or image line of data from the image or a partial scan line (e.g., the first 25%, the second 25%, etc.). It is also possible to store line segments (e.g., 5%, 10%, 25%, 50% of an entire line) or even pixel groupings (e.g., matrices of 16, 64, 100. 144, 200, etc. squares within a matrix). These segments or groupings become the intermediate images or the intermediate image data, and each intermediate image or intermediate image data file contains identity information so that it can be organized when stored, retrieved in a sensible fashion and reconstructed into a final image. These segments or groupings (the term segment hereinafter will be used to collectively describe the intermediate images, whether in line or pixel matrix format) are stored, as in DICOM or other common or universal software language or format, and because the intermediate images are identified (e.g., in the identity data or header section), the intermediate image files are in a retrievable format for reconstruction into a designed image, adaptively reconstructed image, or reconstructed complete final image.

The selection of the parameters for reconstruction of an image (the term reconstruction is used here generically to include adaptive reconstruction and total image reconstruction) can be input by the operator either by specific identification of individual parameters or by selecting a hyper-program that automatically operates on the base data to provide an image with predefined parameters. For example, if the system is capable of providing a high resolution image (using a scholastic scale of 10 as the highest resolution), automated programs may be available for selecting an image with a resolution on the scholastic scale of, 10, 9, 8, 7, 6, 5, etc. at the selection of the operator. Similarly, if the data base has images with a temporal distribution over 10 minutes, there may be an automated program for providing images from 1 minute, 4 minutes and 10 minutes, and this may be done in combination with a scholastic scale image resolution parameters. This offers significant flexibility and speed top the system, as in the following manner. Higher temporal resolution can be obtained by user-selection of image reconstruction from data from 30 second intervals or 60 second intervals. This can be variable according to user requirements in looking at the image data.

It is often desirable to rapidly move through a series of available images to look for specific image features or events that have been imaged. By selecting lower temporal resolution images, the operator can rapidly move through larger numbers of images (they can be retrieved and displayed faster because of the lower temporal resolution (which may be effected by a number of techniques later described herein), and when the operator sees a feature or event of interest, higher spatial resolution on the scholastic scale or shorter time intervals may be selected by the operator and viewed in greater detail.

Simple methods of altering the resolution of an image are reduction of the limber of total available lines used in the displayed image, and the use of smoothing functions to combine those fewer lines into a viewable image. For example, if the total number of available lines for a total image is 1024 lines, a scholastic scale of 9 might use only 960 lines (1024−64 lines, or $^{1}\!/_{16}$ of the total number of lines) and a program to smooth the image where the lines are missing. Similarly a scholastic reading of 8 might be 902 or 896 lines (approximately $^{1}\!/_{10}$ of the lines), a scholastic reading of might be 832 lines, and a scholastic rating of 5 might be 524 lines. The smoothing function would make the 15 removal of lines less obvious by merging data between adjacent lines.

More complex usage of the intermediate images may also be used in actual image search functions. For example, if a total and complete image has a nearly circular object within the image (e.g., a small tamer or cyst), a search function may be provided to look for adjacent lines or groups of pixel matrices that have the specific data content that would be indicative of a circular object. Such data content would be that a series of at least X adjacent lines have contrast data along the adjacent lines that increase in a fairly uniform rate (consistent with the increasing segment length of a circle) and then a next series of Y adjacent lines that have contrast data along the Y adjacent lines that display decreasing segment length (consistent with the decreasing segment length of a circle). When these data events are found in a screening of the base data for a single image frame, either that single total image can be displayed or only that segment (and a framing area for convenience) will be displayed. This enables an automated search of images by considering only intermediate image data (rather than entire images), and even by selecting intermediate image data in specific regions of the image frame (e.g., the central 50% of the image where the targeted area of interest is present).

Applicants use the term aggregating intermediate image data or aggravating intermediate images as a term to exclude the total reconstruction of an image from intermediate image data. In the total reconstruction of an image, essentially 100% of the base data would be used in the reconstruction, or at least all base data in the image would be originally contiguous scans or lines of data with no intermediate scans or lines left out of the image. The term aggregation means that less than 100% of the lines of data available for an image are used in reconstructing a final or intermediate image, and specifically that at least some originally adjacent lines of image from the entire mass of data (or adjacent pixels) are not used in the partial or adaptive reconstruction used in the practice of the present technology. Particularly where there are at least some adjacent lines of image data from within the central regions of the image that are missing, the construction of the image is less amenable to the term reconstruction (which implies return to the original form) and the term aggregation implies a construction with fewer than all image data in the final or intermediate image. By emphasizing adjacent lines (lines of data that are available adjacent to at least two lines used in the construction of the image, or at least a line that would otherwise be intermediate two lines of data used in the constructed image, as where two or more lines that would be adjacent have been removed), the removal of data can be clearly distinguished from cropping wherein entire sections surrounding other images are removed.

C. Delayed Image Reconstruction

Reconstruction of final images according to the technology of the present disclosure is then performed at a later time, the reconstruction performed from an appropriate selection of intermediate image data. No raw data is used. The reconstruction can be performed on another workstation or remotely. Because image data is usually in a common format such as DICOM, this process is vendor independent, acquisition independent, and MR scanner independent in this manner. This is different from raw data, which is typically vendor specific and sometimes MR scanner type specific.

In this description, the steps for reconstruction are: (1) selection of appropriate intermediate images, (2) summation of the appropriate intermediate images. What is meant by the term "appropriate" relates to the selection of intermediate images that are related in space and time so that information (including image data) further developed from the intermediate images can be related, integrated or imagewise associated in a meaningful event. Thus, appropriate would include spatially adjacent points, spatially adjacent lines, spatially adjacent perspective lines, spatially adjacent planes, and such intermediate images also related in a temporal sense, such as sequences of the same spatially adjacent lines over measured or predetermined time intervals. Contrariwise, an inappropriate set of images for summation would include a single point or line from a cranial MRI intermediate image and a single point or slice from an MRI thoracic intermediate image.

In essence, the described technique can be applicable to k-space acquisitions whereby each single acquired k-space data point is converted into a corresponding intermediate image which is stored for later retrieval for summation into a final image. In practice, a line of k-space acquisition data points would be converted into a corresponding intermediate image as a matter of efficiency.

D. Adaptive Image Reconstruction Controls

The selection of appropriate intermediate images can be performed without or with the use of reconstruction. In the nominal case, no adaptive reconstruction is used. For example, a pulse sequence with 256 phase encodes may have been reconstructed initially into 256 intermediate images, each created from a single line of k-space data. These 256 intermediate images are then stored for later reconstruction. At a later time, these intermediate images are reconstructed by summation and displayed as a final image. In certain circumstances, it may be advantageous to have adaptive reconstruction. Adaptive reconstruction involves reconstruction that is responsive to the user's desired imaging parameters, which may be changed in real-time. For instance, a pulse sequence may acquire data continuously in a projection reconstruction manner over a period of minutes, e.g., 6 minutes, such as during breast MRI, after an intravenous injection of contrast.

With the technique described in this invention, each line of the projection reconstruction acquisition is converted into a corresponding intermediate image. The resulting intermediate images are then stored for later reconstruction or with immediate reconstruction in real time or built up in sequence as adaptive reconstruction. The time-stamp information in the image headers is used for determining the order of acquisition of data. The flexibility and other advantages of vendor and MR scanner independent reconstruction are maintained because of the use of an intermediary image format such as DICOM.

An additional aspect of this invention is a user interface that permits a user to directly determine the spatial and temporal resolution of final images to be created. After such selection, final images may be created by the summation of an appropriate number and set of intermediate images.

For example, it may be desired to have both a high spatial resolution final image as well as a set of temporally related lower spatial resolution final images. A high spatial resolution final image may be created by a large number of serial intermediate images each representing a single line of projection reconstruction acquisition. Assume that TPRL is the time to acquire one projection reconstruction line. If 128 intermediate images are required for such an image, it represents a temporal resolution of 128×TPRL.

A series of lower spatial resolution final images with a higher temporal resolution may be obtained, by using a smaller number of intermediate images that are temporally related to each other. For example, 16 projection reconstruction lines may be used to create a lower spatial resolution image with a higher temporal resolution of 16×TPK. This series of final images may then be used for dynamic contrast enhancement evaluation. By storing the individual intermediate images, an operator can select parameters from among spatial image resolution and temporal image resolution to design or tailor an image into a format having the specific image and temporal properties desired at that time. In screening a complex set of images, the speed of image generation from such stored intermediate images can be increased, and then upon identifying an image or field of particular interest, the parameters can be reconfigured and a more exacting image (e.g., greater spatial resolution, narrower temporal resolution) can be generated according to the design intent of the operator.

The user interface permits the real-time adjustment of temporal and spatial resolution of resulting images. This allows for rapid visual feedback. For instance, on creating final dynamic contrast enhancement images (high temporal resolution, low spatial resolution), visual acceptance or rejection of the compromise in spatial resolution that comes with high temporal resolution can be made rapidly by simply changing parameters with the interface, e.g. sliders or dials. Similarly, there can be rapid visual feedback for an acceptable high spatial resolution final image (at the cost of temporal resolution which may increase blur).

Moreover, there can be a combined approach whereby low-spatial resolution, high temporal resolution images are used to find a temporal point of optimal enhancement or tissue contrast followed by a high spatial resolution reconstruction centered in that particular region and temporal point can be made. Alternatively, once a region of interest is being examined in a high spatial resolution image, it may be desired to then create localized high temporal resolution enhancement images in the selected region for real-time characterization.

DESCRIPTION OF THE PREFERRED EMBODIMENT

Referring particularly to FIG. 1, the preferred embodiment of the invention is employed in an MRI system such as the one shown here by way of example. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system. The workstation 10 is coupled to four servers: a pulse sequence server 18; a data acquisition server 20; a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients Gx, Gy and Gz used for position encoding MR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 11 to produce RF pulses of the desired frequency, phase and pulse amplitude waveform.

The RF system 26 also includes one or more RF receiver channels. Each RF receiver channel includes an RF amplifier that amplifies the MR signal received by the coil to which it is connected and a detector which detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1} Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. The data processing server 22 receives MR data from the data acquisition server 20, and stores the data in a raw data file. The format of the raw data We is typically specific to the MRI system vendor, or to a specific system. The raw data file typically includes a header identifying This data file, moreover, is typically temporary, and is deleted when the system is deactivated.

The data is processed in accordance with instructions downloaded from the workstation 10. Such processing may include, for example: Fourier transformation of raw k-space MR data to produce two or three-dimensional images; the application of filters to a, reconstructed image; the performance of a backprojection image reconstruction of acquired MR data; the calculation of functional MR images; the calculation of motion or flow images, etc.

In a typical system, individual scan lines are combined to form data for a complete scan image, which is reconstructed by the data processing server 22, and conveyed back to the workstation 10 where the image can be stored with other images. Real-time images are stored in a data intermediate memory cache (not shown) from which they may be output to operator display 12 or a display which is located near the magnet assembly 30 for use by attending physicians. Batch mode images or selected real time images are stored in a host database on disc storage 44, such as a picture archiving and communicating system (PACS). When such images have been reconstructed and transferred to storage, the data processing saver 22 notifies the data store server 23 on the workstation 10. The workstation 10 may be used by an operator to archive the images in the PACS system., produce films, or send the images via a network to other facilities. Typically, these reconstructed images are stored in a standard, vendor-independent format such as the Digital Imaging and Communications in Medicine (DICOM) standard.

Figure 2:
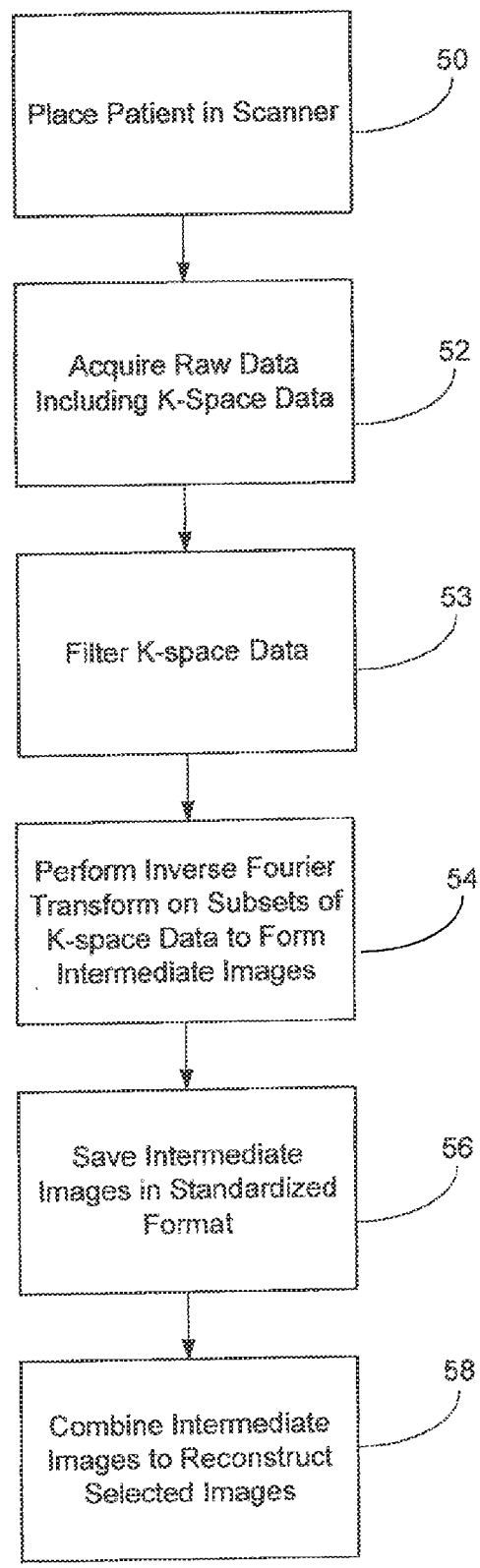
FIG. 2 is a flow chart illustrating the adaptive reconstruction process of the present invention.

Referring now to FIG. 2, a flow chart illustrating the method of the present invention is shown. Here, in process step 50, a patient is placed in an MRI scanner. Subsequently, in process step 52, pulse sequences are applied and consecutive slice images are taken in individual scan lines. These images can be taken using any of the pulse sequences described above. Data acquired from these individual slices or scan lines is, as described above, stored in raw data files in data acquisition server 20.

As or after the raw data is acquired, in process step 53, the data is filtered, and in process step 54, an inverse Fourier transform is applied to sub-sets of the k-space data to reconstruct partial images, which will be referred to herein as intermediate images. This image reconstruction step can be applied to a single point of k-space data an individual line of k-space data from a radially symmetric acquisition scheme such as projection reconstruction or spiral acquisition; a collection of k-space lines such as, for example, a "blade" or "propeller" from a PROPELLER pulse sequence; a single line of k-space data from a rectilinear acquisition such as a Kumar-Welti-Ernst acquisition; a line segment, or a portion of a complete line; a pixel grouping; or to other sub-sets of combined k-space data. Although a filtering step is described prior to the transform step of process step 54, in an alternative construction, the data can be filtered by application of convulation to the intermediate image.

In process step 56, the intermediate images are stored in a standardized format, such as the DICOM format discussed above, and are preferably marked with a time stamp, which can be an actual time of acquisition or, if multiple lines have been acquired, an effective time of data acquisition, such as the mean time of data collection or the start time of a data acquisition. These files can be stored in the workstation 10, and are advantageously stored in an associated PACS system 44, or alternatively to a portable memory storage such as a DVD, a CD, flash drive, portable static RAM, or other medium.

Because an intermediate image is mathematically equivalent to the corresponding sub-set of k-space data (highlighting the relationship of the image domain versus the k-space domain), a full set of collected k-space data is equal to the sum of sub-sets of k-space data, and the inverse Fourier transform of the full set of collected k-space data is also equal to the sum of the inverse Fourier transforms of sub-sets of the collected k-space data. Thus, the stored intermediate images from a given can be retrieved from memory, and, in process step 58, summed together to reconstruct selected images from the intermediate images. The resultant reconstructed image can be the equivalent to a full initial reconstruction of k-space data into one single final image, or selective portions of the intermediate images can be summed to meet the specific temporal and spatial requirements of the user.

Because the intermediate images can be retrieved from the PACS system 44, reconstruction of images can be performed from workstations remote from the MRI system. Thus, for example, the images can be reconstructed at a separate workstation, via an interface to the PACS system, through a network associated with the PACS system, such as from a thin client gateway to a thick server, or from other remote locations at which the intermediate images are available.

All of the data acquired in a scan can be used to reconstruct the final image. However, in one form of the invention, an adaptive reconstruction can be provided in which subsets of the acquired data are combined to provide a spatial and temporal resolution desired by the user. Therefore, the data acquired from a scan can be manipulated to provide an improved visualization, without the need for additional scanning.

The method of the present invention is useful in all types of MRI examinations, and is particularly useful in the field of breast imaging. Breast MRI protocols typically include a high spatial resolution examination and a dynamic contrast enhanced examination. In the latter examination, intravenous contrast is administered and the pattern of enhancement of various breast lesions is observed over a 5-6 minute interval. One pulse sequence that can be used, for example, is a 1 minute long 3D spoiled gradient echo sequence. This is concatenated over the 5-6 minute interval to create 5-6 3D image data sets representing serial images of contrast enhancement at one minute intervals. The 1 minute intervals are required for each acquisition because high spatial resolution is desired. Longer acquisitions are not desired as this would compromise the time interval of assessment of contrast enhancement.

Figure 3:
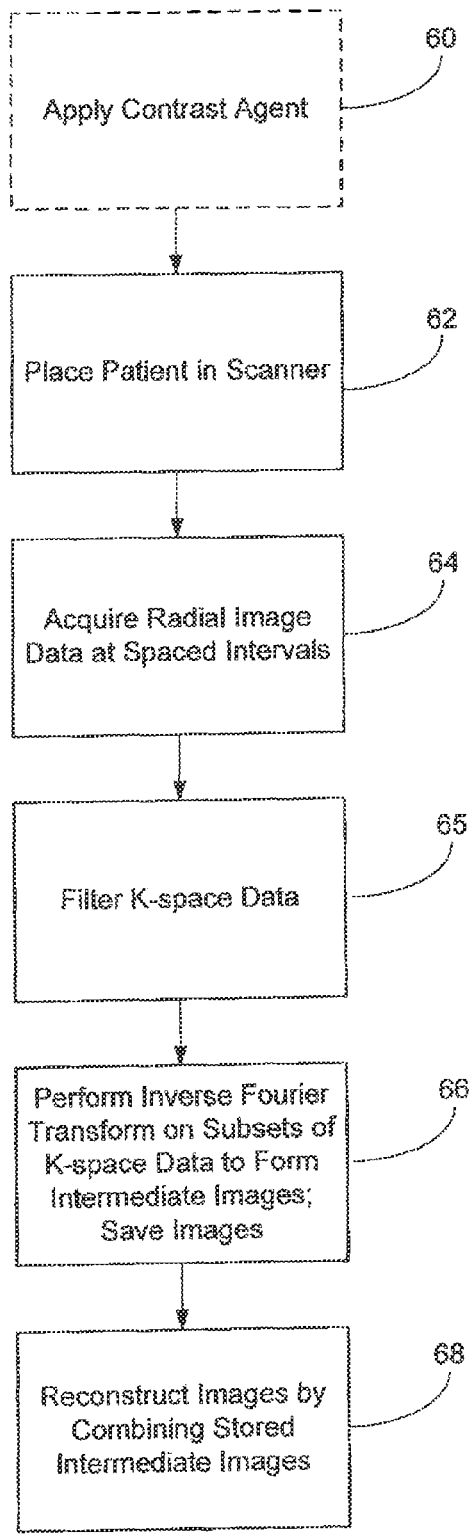
FIG. 3 is a flow chart illustrating a specific application of the adaptive reconstruction process of the present invention.

Referring now to FIG. 3, similar results can be achieved using an adaptive reconstruction, as described below. Here, in one embodiment of the invention, a patient is placed in a scanner (process step 62) and a radial acquisition of k-space data (one radial arm per RF excitation) is performed at continuously incrementing angles over a predetermined time, preferably during contrast enhancement of the target organ (process step 60). Preferably, one radial arm of k-space data is collected per RF excitation during the total time interval of contrast enhancement (process step 64). The radial acquisition is preferably a PROPELLER acquisition, but can also be a spiral k-space acquisition, or other scan types which result in a continuous acquisition of radially oriented arms during a time period. The order of acquisition of the radially oriented anus is variable, and may rotate clockwise or counterclockwise. In either case, the blades are continually acquired, preferably over a 6 minute period, although other time periods can also be used. At the end of each acquisition of a blade, the data is filtered (process step 65), an inverse Fourier transform is performed on the corresponding k-space data (process step 66), and a corresponding intermediate image is obtained, as described above. These images are saved in a DICOM format, and can be stored in a PACS system 44 or other memory storage, also as described above. Although a filtering step is described as taken before the inverse Fourier transform, in an alternative method, convulation can be applied to the intermediate images before or after retrieval by a workstation or other external system.

After the original data acquisition, in process step 68, a user can re-construct images from the stored intermediate image data. The acquired intermediate images are downloaded from the memory storage DICOM format, and a user can interactively select a desired spatial resolution, temporal, resolution, and interval of image reconstruction. Corresponding images are then reconstructed by appropriate summation of the intermediate image data from the acquisition.

As described above, for a proper analysis of the breast, the reconstructed images preferably include one or more high spatial resolution image data set(s), either two or three dimensional, which are created by combining many intermediate images together with associated reduction in temporal resolution, e.g. the images have a high spatial resolution and acquisition is performed over a limited period of time, thereby providing a high resolution intermediate image for comparison purposes, addition, a series of high temporal resolution image data sets (again, either in two or three dimensions) is created by combining a reduced number of intermediate images at stepped time points during the entire dynamic acquisition, thereby providing a series of images that provide changes over time as the contrast enhancement agent is applied, and which can be compared to the high resolution intermediate image.

Because image data rather than raw data is stored in this system, and because reconstruction is performed on MR image files (DICOM format) rather than raw data files, the process is vendor independent, acquisition independent, and MR scanner independent.

As are example, during the acquisition, for a desired spatial resolution, 90 arms of a radially oriented acquisition can be acquired, with the effective time of acquisition equal to the desired time point of acquisition, and with a time separation between reconstructed images equal to a desired temporal interval. Because the 90 images are collected over 90 TR intervals, this represents a temporal resolution of the 90×TR. If a higher temporal resolution is desired, this typically causes a decrease in spatial resolution.

For high spatial resolution, a large number of serially collected radial arms are combined to form a k-space data set for image reconstruction. The temporal resolution of the collected data is reduced as larger number of radial arms corresponds to a longer time period of data collection per desired imaging slice.

Similarly, for high temporal resolution, a smaller number of serially collected radial arms can be combined to form a k-space data set for image reconstruction. Spatial resolution, however, is reduced due to the reduced number of radial arms that are collected, leading to reduced sampling of the desired k-space volume.

Although the invention is described above with respect to MR imaging, the present invention can also be used with computed tomography (CT) scanning. X-ray CT involves the use of an X-ray source and the detection of transmitted X-rays on the other side of the object to be imaged (usually a patient) nominally with a row of X-ray detectors, or using multiple parallel rows of detectors in a technique called multi-detector CT or MDCT. Typically, the traditional method used for creation of X-ray computed tomography (CT) images is known as filtered back projection. In the 2D case, detector data from multiple projections of X-rays through an object is re-binned into parallel beams of X-rays. Each re-binned collection represents a "projection" or "view" through the object. Mathematically, each projection represents a single line of data in the Fourier representation of the final image, and therefore is similar to projection reconstruction MR techniques.

In filtered back-projection, data from each view is filtered then projected through the image space, summing on top of data from other projected views. This is mathematically the equivalent of summing projection reconstruction lines in the Fourier space and filtering the final data prior to Inverse Fourier Transform. The 3D case is simply a more complex version of filtered back projection or this Fourier pathway equivalent.

In the case of computed tomography imaging, a patient is initially positioned in a scanner, and detector data from multiple projections of X-rays are acquired and re-binned into parallel beams of X-rays. A Fourier transform is performed on each projection, and the resultant image is filtered by multiplication to provide intermediate images. These intermediate images can them be summed together to provide images of varying spatial and temporal resolution, as discussed above.

It should be understood that the methods and apparatuses described above are only exemplary and do not limit the scope of the invention, and that various modifications could be made by those skilled in the art that would fall under the scope of the invention. To apprise the public of the scope of this invention, the following claims are made:

We claim:

1. A method for displaying image data from a medical image scanner using a computer system having a display, the method comprising acts of:

presenting, to a user in the display of the computer, a user interface;

receiving, via the user interface, a selection of user-defined parameters for constructing a reconstructed image, wherein the selection of user-defined parameters further includes at least one of a spatial distribution and a temporal distribution parameters;

receiving and saving a plurality of intermediate images in a standard format, the plurality of intermediate images acquired from the medical image scanner; and retrieving and reconstructing the reconstructed image by aggregating a set of the plurality of the intermediate images, the set corresponding to the user-defined parameters.

2. The method of claim 1, further comprising acts of:

acquiring k-space data through magnetic resonance (MR) imaging;

performing an inverse Fourier transform on the acquired k-space data of to form an intermediate image;

saving the intermediate image in the standard format; and iteratively performing the steps of acquiring, performing, and saving until the plurality intermediate images are stored for the acquired k-space data.

3. The method of claim 1, further comprising acts of:

performing a Computed Tomography (CT) medical imaging scan on an area of interest of a patient;

acquiring a plurality of projections from the CT medical imaging scan;

filtering each of the plurality of projections; and performing a Fourier transform on each of the projections to form the plurality of intermediate images.

4. The method of claim 1, further comprising an act of displaying, via the display, the reconstructed image conforming to the user-defined parameters.

5. The method of claim 1, wherein the act of receiving the selection of user-defined parameters further includes an act of receiving the selection of at least one of spatial resolution parameters and temporal resolution parameters.

6. The method of claim 5, further including acts of:

receiving another selection of user-defined parameters having one of adjusted spatial resolution parameters or adjusted temporal resolution parameters; and retrieving and reconstructing the reconstructed image by aggregating another set of the plurality of the intermediate images, the another set corresponding to the another selection.

7. The method of claim 1, wherein the act of receiving the selection of user-defined parameters further includes an act of receiving the parameters for a hyper-program, and the method further comprises analyzing the plurality intermediate images to retrieve and reconstruct an image having one of a resolution on a scholastic scale or a temporal range, associated with the plurality of intermediate images.

8. The method of claim 1, further comprising an act of receiving, via the user interface, a search selection for selectively searching the intermediate images for data having specific data content.

9. The method of claim 1, further comprising receiving, via the user interface, a selection identifying a field of interest within the reconstructed image; and retrieving and reconstructing the reconstructed image by aggregating another set of the plurality of the intermediate images, the another set corresponding to the selection identifying the field of interest.

10. A system for displaying image data for reconstruction of images from a medical image scanner, the system comprising:

a user interface configured to be presented, to a user in a display, and configured to receive a selection of user-defined parameters for constructing a reconstructed image, the selection of user-defined parameters further includes at least one of spatial distribution parameters and temporal distribution parameters;

a processor, coupled to the user interface, and configured to:
receive and save a plurality of intermediate images in a standard format, the plurality of intermediate images are acquired from the medical image scanner; and
retrieve and reconstruct the reconstructed image by aggregating a set of the plurality of the intermediate images, the set corresponding to the user-defined parameters; and a storage medium coupled to the processor, configured to store the plurality of intermediate images.

11. The system of claim 10, wherein the processor is further configured to:
acquire k-space data through magnetic resonance (MR) imaging;
perform an inverse Fourier transform on the acquired k-space data of to form an intermediate image;
save the intermediate image in the standard format; and
iteratively performing the steps of acquiring, performing, and saving until the plurality intermediate images are stored for the acquired k-space data.

12. The system of claim 10, wherein the processor is further configured to:
perform a Computed Tomography (CT) medical imaging scan on an area of interest of a patient;
acquire a plurality of projections from the CT medical imaging scan;
filter each of the plurality of projections; and
perform a Fourier transform on each of the projections to form the plurality of intermediate images.

13. The system of claim 10, further comprising a display configured to display the reconstructed image.

14. The system of claim 10, wherein the selection of user-defined parameters includes at least one of spatial resolution parameters and temporal resolution parameters.

15. The system of claim 14, wherein the user interface is configured to receive another selection of user-defined parameters having one of adjusted spatial resolution parameters or adjusted temporal resolution parameters, and the processor is configured to retrieve and reconstruct the reconstructed image by aggregating another set of the plurality of the intermediate images, the another set corresponding to the another selection.

16. The system of claim 10, wherein the user interface is configured to receive a selection of parameters for a hyper-program, and wherein the processor is further configured to execute the hyper-program configured to analyze the plurality intermediate images to retrieve and reconstruct an image having one of a resolution on a scholastic scale or a temporal range, associated with the plurality of intermediate images.

17. The system of claim 10, wherein the user interface is configured to receive a search selection for selectively searching the intermediate images for data having specific data content.

18. The system of claim 10, wherein the user interface is configured to receive a selection identifying a field of interest within the reconstructed image, and the processor is configured to retrieve and reconstruct the reconstructed image by aggregating another set of the plurality of the intermediate images, the another set corresponding to the selection identifying the field of interest.

* * * * *

UNITED STATES PATENT AND TRADEMARK OFFICE
CERTIFICATE OF CORRECTION

PATENT NO. : 8,509,513 B2  
APPLICATION NO. : 13/412043  
DATED : August 13, 2013  
INVENTOR(S) : Cameron A. Piron et al.

Page 1 of 1

It is certified that error appears in the above-identified patent and that said Letters Patent is hereby corrected as shown below:

On the title page of the Patent, below item (65), and above item (51), please insert:

-- Related U.S. Application Data

(63) Continuation of application No. 12/056,908, filed on Mar. 27, 2008, now Pat. No. 8,155,417.

(60) Provisional application No. 60/920,355, filed Mar. 27, 2007. --

Signed and Sealed this  
First Day of October, 2013

Teresa Stanek Rea  
*Deputy Director of the United States Patent and Trademark Office*